United States Patent
Cheng et al.

(10) Patent No.: US 9,917,162 B2
(45) Date of Patent: Mar. 13, 2018

(54) FABRICATION OF VERTICAL FIELD EFFECT TRANSISTOR STRUCTURE WITH CONTROLLED GATE LENGTH

(71) Applicants: INTERNATIONAL BUSINESS MACHINES CORPORATION, Armonk, NY (US); GLOBALFOUNDRIES Inc., Grand Cayman (KY)

(72) Inventors: Kangguo Cheng, Schenectady, NY (US); Ruilong Xie, Niskayuna, NY (US); Tenko Yamashita, Schenectady, NY (US); Chun-Chen Yeh, Clifton Park, NY (US)

(73) Assignees: International Business Machines Corporation, Armonk, NY (US); GlobalFoundries Inc., Grand Cayman (KY)

( * ) Notice: Subject to any disclaimer, the term of this patent is extended or adjusted under 35 U.S.C. 154(b) by 0 days.

(21) Appl. No.: 15/353,352

(22) Filed: Nov. 16, 2016

(65) Prior Publication Data

US 2017/0288030 A1     Oct. 5, 2017

Related U.S. Application Data

(62) Division of application No. 15/087,074, filed on Mar. 31, 2016, now Pat. No. 9,711,618.

(51) Int. Cl.
*H01L 29/417* (2006.01)
*H01L 21/28* (2006.01)
(Continued)

(52) U.S. Cl.
CPC .. *H01L 29/41741* (2013.01); *H01L 21/02266* (2013.01); *H01L 21/28114* (2013.01);
(Continued)

(58) Field of Classification Search
CPC ......... H01L 29/66545; H01L 29/66666; H01L 29/66787; H01L 29/7827; H01L 21/02167;
(Continued)

(56) References Cited

U.S. PATENT DOCUMENTS

| 6,027,975 A | 2/2000 | Hergenrother et al. |
| 6,197,641 B1 | 3/2001 | Hergenrother et al. |

(Continued)

OTHER PUBLICATIONS

Hergenrother, J.M. et al., "The Vertical Replacement-Gate (VRG) MOSFET: A 50-nm Vertical MOSFET with Lithography-Independent Gate Length" IEEE (1999) pp. 75-78.

(Continued)

*Primary Examiner* — Jarrett Stark
(74) *Attorney, Agent, or Firm* — Tutunjian & Bitetto, P.C.; Vazken Alexanian

(57) ABSTRACT

A method of forming a gate structure, including forming one or more vertical fins on a substrate; forming a bottom spacer on the substrate surface adjacent to the one or more vertical fins; forming a gate structure on at least a portion of the sidewalls of the one or more vertical fins; forming a gauge layer on at least a portion of the bottom spacer, wherein the gauge layer covers at least a portion of the gate structure on the sidewalls of the one or more vertical fins; and removing a portion of the gauge layer on the bottom spacer.

20 Claims, 14 Drawing Sheets

(51) Int. Cl.
*H01L 29/78* (2006.01)
*H01L 21/02* (2006.01)
*H01L 29/66* (2006.01)

(52) U.S. Cl.
CPC .. *H01L 21/28123* (2013.01); *H01L 29/66545* (2013.01); *H01L 29/66666* (2013.01); *H01L 29/7827* (2013.01)

(58) Field of Classification Search
CPC ........... H01L 29/42376; H01L 21/0217; H01L 21/02277; H01L 29/7831
See application file for complete search history.

(56) References Cited

U.S. PATENT DOCUMENTS

| | | | |
|---|---|---|---|
| 6,355,563 B1 * | 3/2002 | Cha | H01L 21/76802 257/E21.576 |
| 6,653,181 B2 | 11/2003 | Hergenrother et al. | |
| 6,846,709 B1 | 1/2005 | Lojek | |
| 7,446,025 B2 | 11/2008 | Cohen et al. | |
| 7,872,302 B2 * | 1/2011 | Kim | H01L 29/66666 257/329 |
| 8,164,146 B2 * | 4/2012 | Lung | B82Y 10/00 257/413 |
| 8,211,809 B2 | 7/2012 | Masuoka et al. | |
| 8,435,851 B2 | 5/2013 | Erickson et al. | |
| 8,476,132 B2 * | 7/2013 | Masuoka | H01L 21/823885 257/329 |
| 8,551,848 B2 | 10/2013 | Kerber et al. | |
| 8,999,791 B2 | 4/2015 | Cheng et al. | |
| 9,059,206 B2 | 6/2015 | Doris et al. | |
| 9,437,503 B1 * | 9/2016 | Mallela | H01L 21/8238 |
| 9,443,982 B1 * | 9/2016 | Balakrishnan | H01L 29/66742 |
| 2007/0166914 A1 * | 7/2007 | Chen | H01L 21/84 438/243 |
| 2010/0213539 A1 * | 8/2010 | Masuoka | H01L 21/84 257/329 |
| 2010/0219483 A1 * | 9/2010 | Masuoka | H01L 21/845 257/369 |
| 2010/0301402 A1 * | 12/2010 | Masuoka | H01L 21/26586 257/288 |
| 2011/0303985 A1 * | 12/2011 | Masuoka | H01L 21/84 257/369 |
| 2012/0181663 A1 * | 7/2012 | Lukaitis | H01L 28/20 257/536 |
| 2013/0095623 A1 * | 4/2013 | Guo | H01L 29/4983 438/268 |
| 2015/0129831 A1 * | 5/2015 | Colinge | H01L 29/0676 257/9 |
| 2015/0318288 A1 * | 11/2015 | Lim | H01L 27/1104 257/329 |
| 2016/0284712 A1 * | 9/2016 | Liaw | H01L 27/1104 |
| 2016/0293756 A1 * | 10/2016 | Liu | H01L 29/7827 |

OTHER PUBLICATIONS

List of IBM Patents or Patent Applications Treated as Related dated Nov. 16, 2016, 2 pages.

* cited by examiner

FABRICATION OF VERTICAL FIELD EFFECT TRANSISTOR STRUCTURE WITH CONTROLLED GATE LENGTH

BACKGROUND

Technical Field

The present invention relates to fabricating a vertical field effect transistor (VFET) structure with a controlled gate length, and more particularly to controlling a gate length for a VFET by utilizing a more accurately controllable deposition process to define a gate structure.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and finFETs have been formed with the channel extending outward from the substrate, but where the current also flows horizontally from a source to a drain. The channel for the finFET can be an upright slab of thin rectangular Si, commonly referred to as the fin with a gate on the fin, as compared to a MOSFET with a single gate in the plane of the substrate. Depending on the doping of the source and drain, an n-FET or a p-FET may be formed.

Examples of FETs can include a metal-oxide-semiconductor field effect transistor (MOSFET) and an insulated-gate field-effect transistor (IGFET). Two FETs also may be coupled to form a complementary metal oxide semiconductor (CMOS), where a p-channel MOSFET and n-channel MOSFET are connected in series.

With ever decreasing device dimensions, forming the individual components and electrical contacts become more difficult. An approach is therefore needed that retains the positive aspects of traditional FET structures, while overcoming the scaling issues created by forming smaller device components.

SUMMARY

A method of forming a gate structure, including forming one or more vertical fins on a substrate; forming a bottom spacer on the substrate surface adjacent to the one or more vertical fins; forming a gate structure on at least a portion of the sidewalls of the one or more vertical fins; forming a gauge layer on at least a portion of the bottom spacer, wherein the gauge layer covers at least a portion of the gate structure on the sidewalls of the one or more vertical fins; and removing a portion of the gauge layer on the bottom spacer.

A method of forming a gate structure including forming one or more vertical fins on a substrate; forming a bottom spacer on the substrate surface adjacent to the one or more vertical fins; forming a high-K dielectric layer on at least the exposed surface of the bottom spacer and the sidewalls of the one or more vertical fins; forming a work function layer on the high-K dielectric layer; forming a gate metal layer on the work function layer; forming a nitride layer on at least a portion of the gate metal layer over the bottom spacer, wherein the nitride layer covers at least a portion of the gate metal layer on the sidewalls of the one or more vertical fins; removing at least a portion of the gate metal layer, work function layer, and high-K dielectric layer on the sidewalls of the one or more vertical fins; forming an oxide layer on at least a portion of the sidewalls of the one or more vertical fins, and over the nitride layer; forming a SiBCN layer on at least a portion of the oxide layer on the sidewalls of the one or more vertical fins; removing a portion of the oxide layer, a portion of the nitride layer, a portion of the gate metal layer, and a portion of the work function layer between neighboring vertical fins; removing the exposed portion of the nitride layer on the gate metal layer, to form a gate structure on the sidewalls of the one or more vertical fins; and forming a gate metal fill to provide an electrical contact with the gate metal layer.

A vertical fin field effect transistor (finFET), including one or more vertical fins formed on a substrate; a doped region in the substrate located below at least one of the one or more vertical fins; a bottom spacer on the substrate and adjacent the sidewall of at least one of the one or more vertical fins; a gate structure on at least a portion of the sidewalls of at least one of the one or more vertical fins; and a gauge layer having a thickness, wherein a bottom surface of the gauge layer is on at least a portion of the gate structure and a top surface of the gauge layer is coplanar with an edge of the gate structure on at least a portion of the sidewalls of at least one of the one or more vertical fins.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
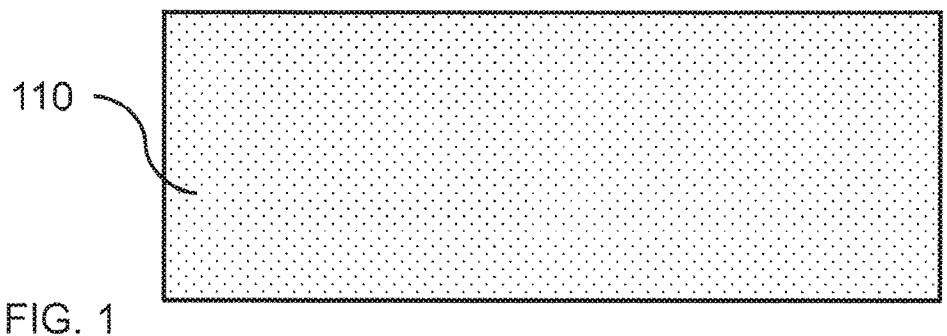
FIG. 1, which is a cross-sectional side view of a substrate in accordance with an exemplary embodiment.

Principles and embodiments of the present disclosure relate generally to an approach to fabricate a gate structure on a narrow vertical field effect transistor (VFET), or more specifically a vertical finFET, where current flows vertically through the channel, by defining the gate height via a deposition process instead of an etching process. A deposition process may provide greater control over component thicknesses than etching processes.

Principles and embodiments also relate to forming one or more vertical fin field effect transistor (vertical finFETs) with a gate structure utilizing a high-K dielectric layer and a directionally deposited gauge material. In one or more embodiments, a directional gas cluster ion beam may be used to deposit a gauge material having a controlled height in trenches between vertical fins, where the gauge material thickness can determine a gate length.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein s for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGs. It will be understood that the spatially relative terms are intended to encompass different orientations of the device in use or operation addition to the orientation depicted in the FIGS. For example, if the device in the FIGs. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

While exemplary embodiments have been shown for a particular device, it should be understood that a plurality of such devices may be arranged and/or fabricated on a substrate to form integrated devices that may be integrated onto a substrate, for example through very large scale integration to produce complex devices such a central processing units (CPUs) and application specific integrated circuits (ASICs). The present embodiments may be part of a device or circuit, and the circuits as described herein may be part of a design for an integrated circuit chip.

Referring now to the drawings in which like numerals represent the same or similar elements and initially to FIG. 1, which is a cross-sectional side view of a substrate in accordance with an exemplary embodiment.

In one or more embodiments, a substrate 110 may be a semiconductor or an insulator with an active surface semiconductor layer. The substrate may be crystalline, semi-crystalline, microcrystalline, or amorphous. The substrate may be essentially (i.e., except for contaminants) a single element (e.g., silicon), primarily (i.e., with doping) of a single element, for example, silicon (Si) or germanium (Ge), or the substrate may include a compound, for example, $Al_2O_3$, $SiO_2$, GaAs, SiC, or SiGe. The substrate may also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate may also have other layers forming the substrate, including high-k oxides and/or nitrides. In one or more embodiments, the substrate 110 may be a silicon wafer. In an embodiment, the substrate is a single crystal silicon wafer.

Figure 2:
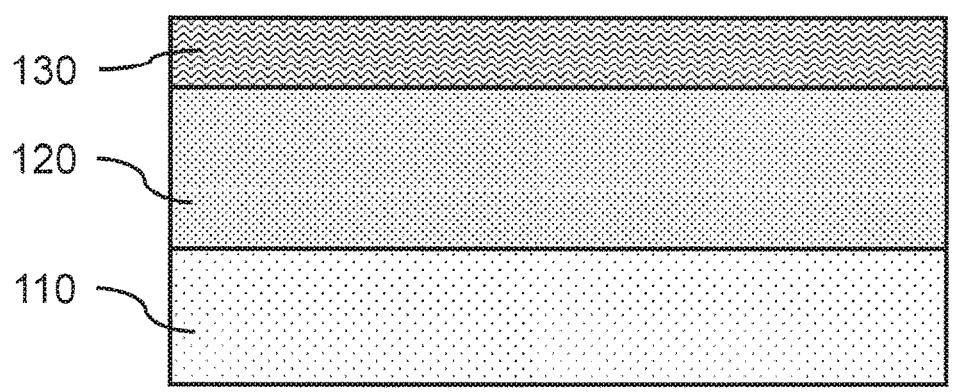
FIG. 2 is a cross-sectional side view of a substrate with a hardmask layer and a photo mask layer in accordance with an exemplary embodiment.

FIG. 2 is a cross-sectional side view of a substrate with a hardmask layer and a photo mask layer in accordance with an exemplary embodiment.

In one or more embodiments, a hardmask layer 120 may be formed on a exposed surface of the substrate 110. A photo mask layer 130 may be formed on the exposed surface of the hardmask layer 120. In various embodiments, the hardmask layer may be an oxide, for example, silicon oxide (SiO), a nitride, for example, a silicon nitride (SiN), or an oxynitride, for example, silicon oxynitride (SiON). In various embodiments, a photo mask layer 130 may be a temporary resist (e.g., PMMA) that may be deposited on the hardmask layer 120, patterned, and developed. The photo mask layer 130 may be a positive resist or a negative resist.

In various embodiments, the hardmask layer 120 may have a thickness in the range of about 40 nm to about 50 nm, although other thicknesses are contemplated.

Figure 3:
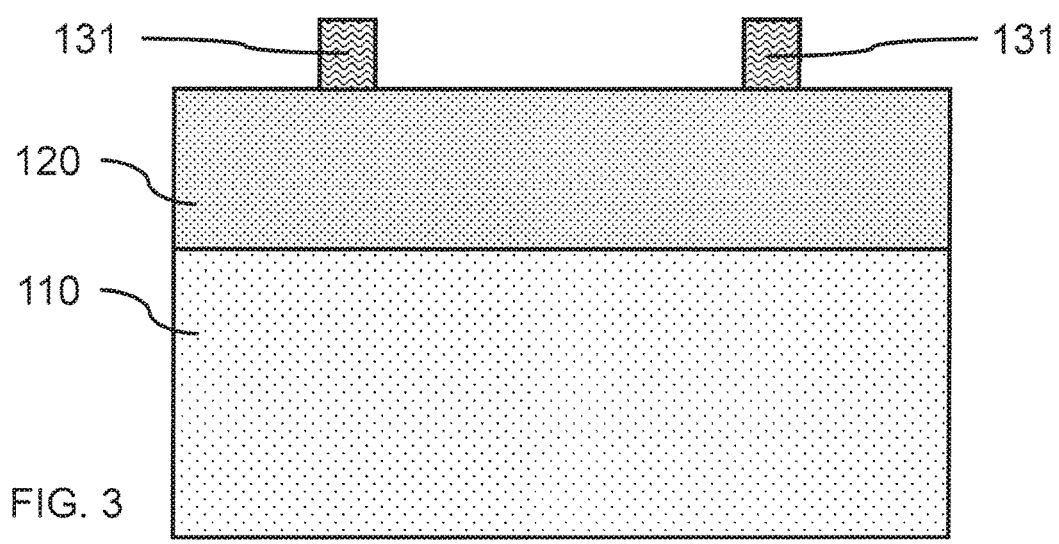
FIG. 3 is a cross-sectional side view of a photo mask layer patterned on the hardmask layer in accordance with an exemplary embodiment.

FIG. 3 is a cross-sectional side view of a photo mask layer patterned on the hardmask layer in accordance with an exemplary embodiment.

In one or more embodiments, the photo mask layer 130 may be patterned and developed to form photo mask blocks 131 covering at least a portion of the surface of the hardmask layer 120. The photo mask blocks may protect the covered portion of the hardmask layer 120, while exposed portions of the hardmask layer 120 are etched to form hardmask fin templates on the substrate 110. One or more photo mask blocks may define the width, length, and pitch of the one or more hardmask fin templates and thereby, the width, length, and pitch of the one or more vertical fins.

In one or more embodiments, the photo mask blocks 131 may have a width in the range of about 6 nm to about 20 nm, or may have a width in the range of about 8 nm to about 15 nm, or may have a width in the range of about 10 nm to about 12 nm. The photo mask blocks 131 may have a length in the range of about 10 nm to about 300 nm, or in the range of about 10 nm to about 200 nm, or in the range of about 10 nm to about 100 nm.

Figure 4:
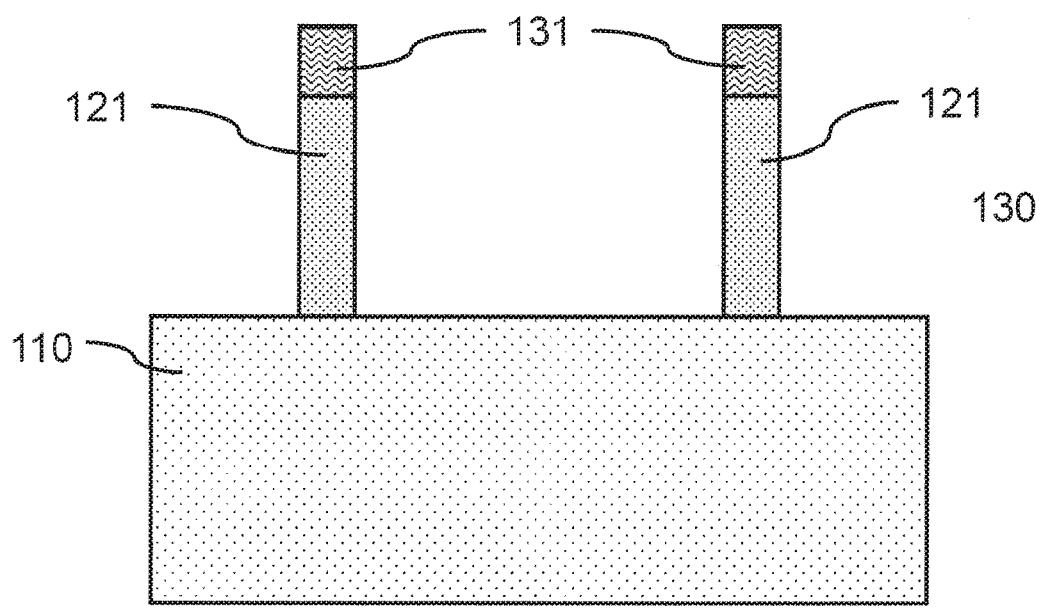
FIG. 4 is a cross-sectional side view of a hardmask fin template and photo mask block on the substrate in accordance with an exemplary embodiment.

FIG. 4 is a cross-sectional side view of a hardmask fin template and photo mask block on the substrate in accordance with an exemplary embodiment.

In one or more embodiments, the hardmask layer 120 may be etched to form one or more hardmask fin template(s) 121, where the photo mask blocks 131 defined the width and location of the hardmask fin template(s) 121 on the substrate 110. In various embodiments, the hardmask fin template(s) 121 may have a pitch in the range of about 40 nm to about 75 nm. In various embodiments, the hardmask layer 120 may be silicon nitride (SiN), for example, $Si_3N_4$.

Figure 5:
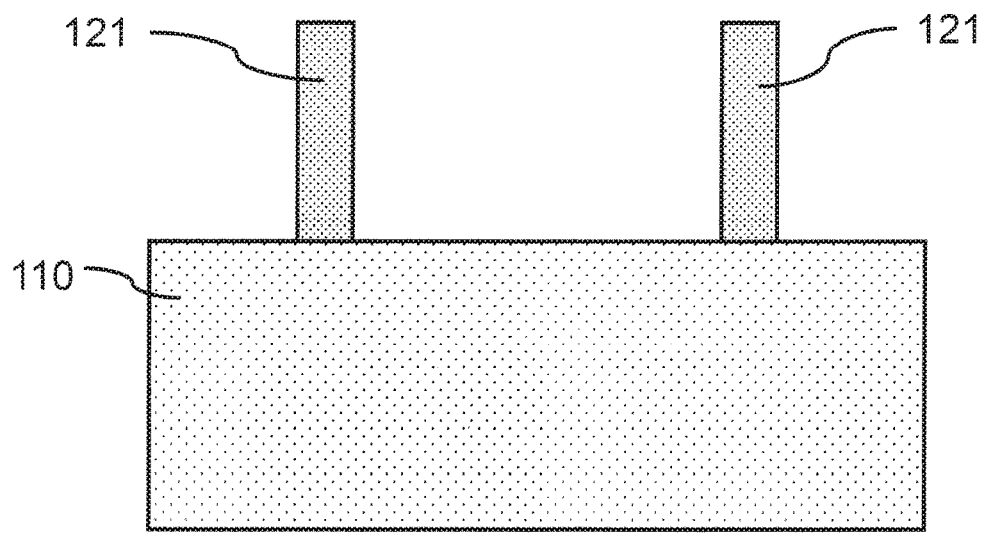
FIG. 5 is a cross-sectional side view of a hardmask fin template on the substrate in accordance with an exemplary embodiment.

FIG. 5 is a cross-sectional side view of a hardmask fin template on the substrate in accordance with an exemplary embodiment.

In one or more embodiments, the photo mask blocks 131 may be removed to expose the top surface(s) of the one or more hardmask fin template(s) 121. The photo mask blocks 131 may be removed by known stripping methods. In one or more embodiments, the hardmask fin template(s) 121 may have a width in the range of about 6 nm to about 20 nm, or may have a width in the range of about 8 nm to about 15 nm, or may have a width in the range of about 10 nm to about 12 nm.

Figure 6:
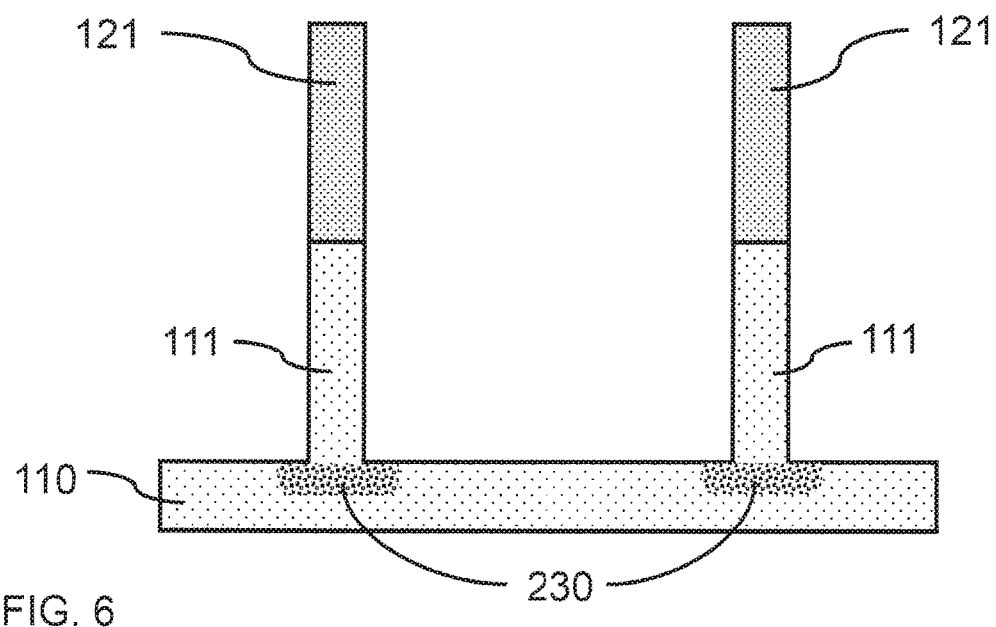
FIG. 6 is a cross-sectional side view of a hardmask fin template on a vertical fin on the substrate in accordance with an exemplary embodiment.

FIG. 6 is a cross-sectional side view of a hardmask fin template on a vertical fin on the substrate in accordance with an exemplary embodiment.

In one or more embodiments, a vertical fin 111 may be formed from the substrate 110 by etching the substrate between the hardmask fin template(s) 121. The substrate may be etched by reactive ion etching (RIE) to provide a directional etch with control of sidewall etching. In various embodiments, the substrate may be etched using a dry plasma etch.

In various embodiments, the fins may have a width in the range of about 6 nm to about 20 nm, or may have a width in the range of about 8 nm to about 15 nm, or in the range of about 10 nm to about 12 nm.

In various embodiments, the fins may have a height in the range of about 25 nm to about 75 nm, or in the range of about 40 nm to about 50 nm.

In one or more embodiments, a doped region 230 (i.e., source/drain region) may be formed in the substrate 110. The doped region 230 may be formed below the vertical fin(s) 111. The dopant may be provided to the doped region(s) (i.e., source/drain region(s)) by ion implantation, and source/drains formed by annealing the doped region(s) 230. In various embodiments, the doped region may be n-doped or p-doped. The doped region 230 may form a bottom source/drain. It should be noted that the source and drain can be interchangeable between the top and bottom locations of a vertical fin, where the doped region in the substrate may act as a source or a drain.

Figure 7:
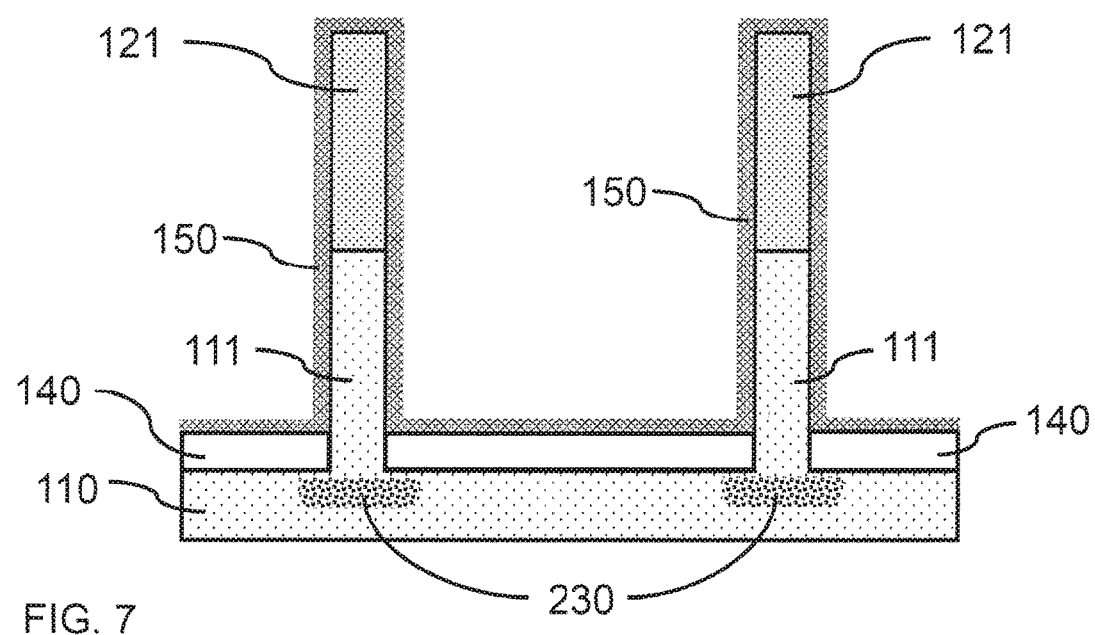
FIG. 7 is a cross-sectional side view of a high-K dielectric layer over the hardmask fin template, vertical fin, and bottom spacer in accordance with an exemplary embodiment.

FIG. 7 is a cross-sectional side view of a high-K dielectric layer over the hardmask fin template, vertical fin, and bottom spacer in accordance with an exemplary embodiment.

In one or more embodiments, a bottom spacer 140 may be formed on the exposed surface of the substrate 110. The bottom spacer 140 may be an oxide, for example, silicon oxide (SiO), a nitride, for example, a silicon nitride (SiN), or an oxynitride, for example, silicon oxynitride (SiON).

In one or more embodiments, the bottom spacer 140 may have a thickness in the range of about 3 nm to about 10 nm, or in the range of about 3 nm to about 5 nm. The thickness of the bottom spacer 140 may define a distance between the surface of the substrate to the start of a gate structure.

In one or more embodiments, a high-K dielectric layer 150 may be formed over the hardmask fin template 121, vertical fin 111, and bottom spacer 140. The high-K dielectric layer may form part of a gate structure, where the gate structure may be on a vertical fin.

In various embodiments, the high-K dielectric layer 150 may include but is not limited to metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$). The high-k material may further include dopants such as lanthanum and/or aluminum. The stoichiometry of the high-K compounds may vary.

In various embodiments, the high-K dielectric layer 150 may have a thickness in the range of about 1.5 nm to about 2.5 nm.

Figure 8:
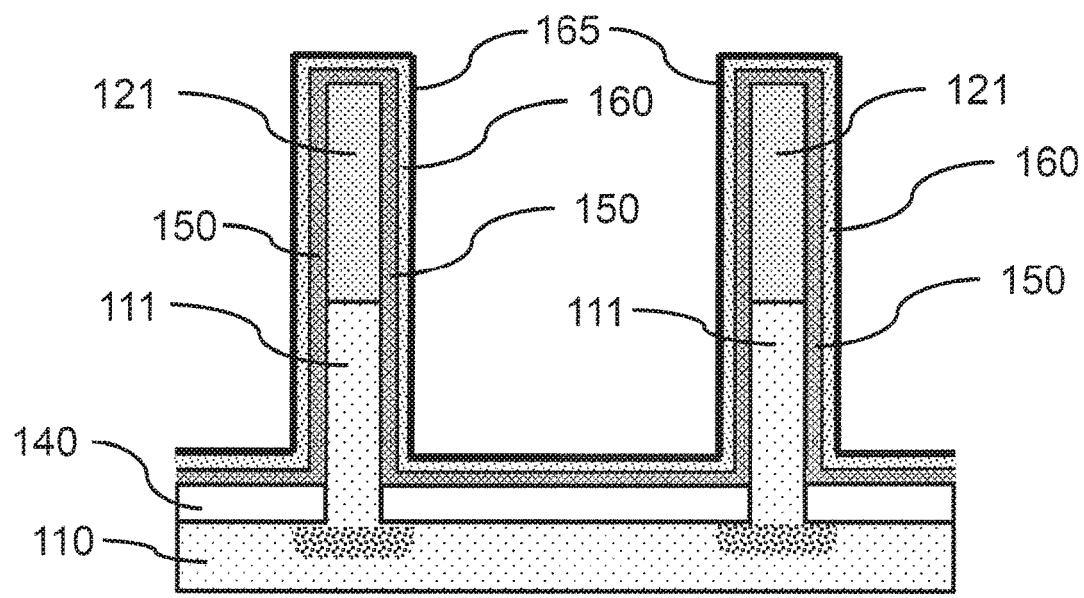
FIG. 8 is a cross-sectional side view of a work function layer and a high-K dielectric layer over the hardmask fin template, vertical fin, and bottom spacer in accordance with an exemplary embodiment.

FIG. 8 is a cross-sectional side view of a work function layer and a high-K dielectric layer over the hardmask fin template, vertical fin, and bottom spacer in accordance with an exemplary embodiment.

In one or more embodiments, a work function layer 160 may be deposited over the high-K dielectric layer 150. The work function layer 160 may form part of a gate structure, where the gate structure may be on a vertical fin.

In various embodiments, the work function layer 160 may be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC), tantalum carbide (TaC), hafnium carbide (HfC), and combinations thereof.

In various embodiments, the work function layer 160 may have a thickness in the range of about 3 nm to about 11 nm, or may have a thickness in the range of about 5 nm to about 8 nm.

In one or more embodiments, a gate metal layer 165 may be formed on the work function layer 160, where the gate metal layer 165 may be a thin layer conformally deposited on the work function layer 160. The gate metal layer 165 may be conformally deposited by atomic layer deposition (ALD), where the gate metal layer 165 may have a thickness in the range of about 5 Å to about 15 Å. In various embodiments, the gate metal layer 165 may be tungsten (W), cobalt (Co), or a combination thereof. The total thickness of the gate metal layer 165 and the work function layer 160 may be in the range of about 6 nm to about 12 nm. The gate metal layer 165 may form part of a gate structure, where the gate structure may be on a vertical fin.

Figure 9:
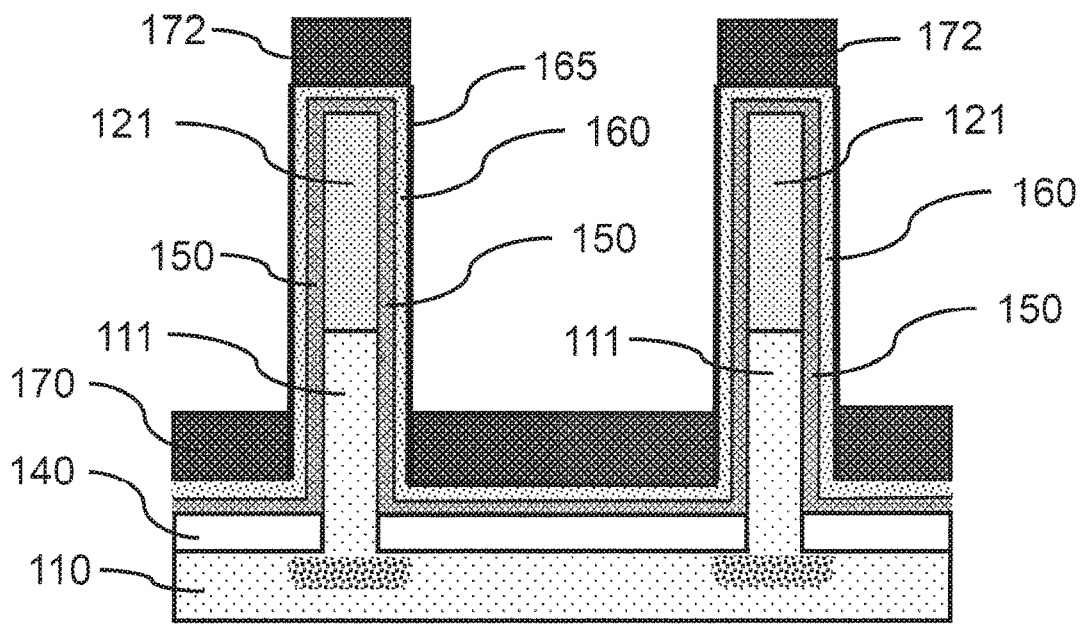
FIG. 9 is a cross-sectional side view of a gauge layer and fin cap on the hardmask fin template, vertical fin, and bottom spacer in accordance with an exemplary embodiment.

FIG. 9 is a cross-sectional side view of a gauge layer and fin cap on the hardmask fin template, vertical fin, and bottom spacer in accordance with an exemplary embodiment.

In one or more embodiments, a fin cap 172 may be formed on the top of the hardmask fin template 121, and a gauge layer 170 may be formed on the exposed surface of the gate metal layer 165 over the bottom spacer 140. The gauge layer 170 may be coplanar with the substrate surface. The gauge layer 170 and fin cap 172 may be formed on the top of the hardmask fin template 121 and the exposed surface of the gate metal layer 165 over the bottom spacer 140 by a directional deposition. In various embodiments, the gauge layer 170 and fin cap 172 may be deposited by gas cluster ion beam, where the gauge layer and fin cap material may be simultaneously deposited. The material of the gauge layer 170 and fin cap 172 may be a nitride, for example, silicon nitride (SiN). In various embodiments, the gauge layer 170 can be a nitride layer, and the fin cap 172 can be a nitride cap. The gauge layer 170 may have a thickness that defines the gate length, $L_g$, on the sidewall of the vertical fin 111. The gauge layer 170 may protect the work function layer 160 and the gate metal layer 165 forming a gate structure on the sidewalls of the vertical fin 111 from subsequent removal/etching processes.

In one or more embodiments, the gauge layer 170 may have a thickness in the range of about 10 nm to about 50 nm, or in the range of about 15 nm to about 25 nm.

Figure 10:
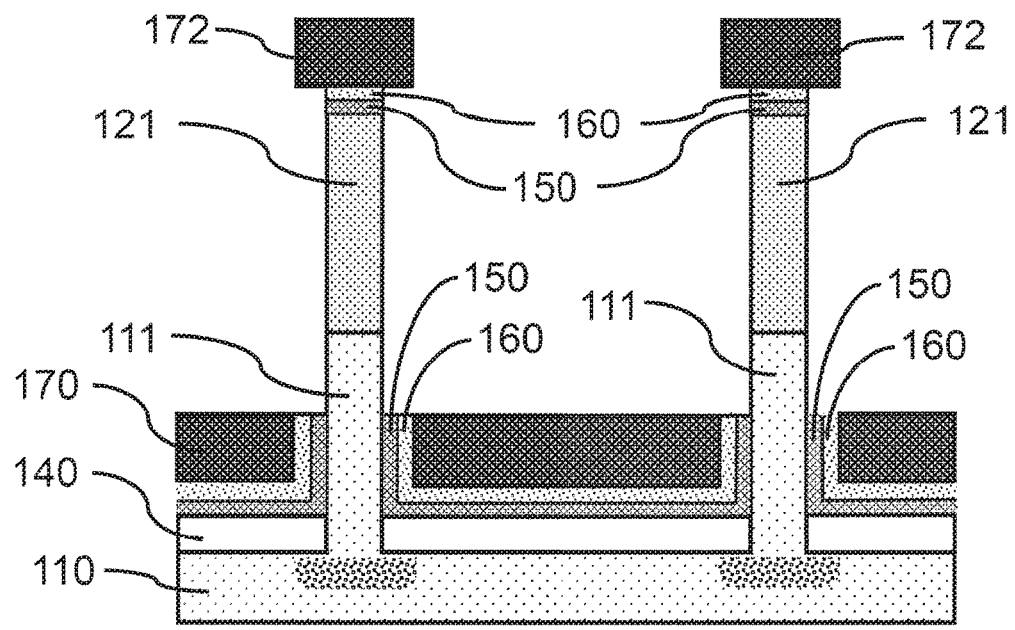
FIG. 10 is a cross-sectional side view of exposed sidewalls of a vertical fin with a gauge layer and fin cap in accordance with an exemplary embodiment.

FIG. 10 is a cross-sectional side view of exposed sidewalls of a vertical fin with a gauge layer and fin cap in accordance with an exemplary embodiment.

In one or more embodiments, the high-K dielectric layer 150, the work function layer 160 and the gate metal layer 165 of a gate structure may be removed from at least a portion of the vertical sidewalls of the one or more vertical fins 111 and hardmask fin template(s) 121 to expose the vertical sidewalls of the one or more vertical fins 111 and hardmask fin template(s) 121. The gauge layer 170 may prevent the removal of at least the portion of the gate structure including the high-K dielectric layer 150, the work function layer 160, and the gate metal layer 165 below the top surface of the gauge layer 170. The gauge layer 170 and fin cap(s) 172 may protect the covered portion of the gate structure including the high-K dielectric layer 150, the work function layer 160 and the gate metal layer 165 from etching. A top surface of the gauge layer may be coplanar with an edge of the gate structure on at least a portion of the sidewalls of at least one of the one or more vertical fins. A portion of the high-K dielectric layer 150, the work function layer 160, and the gate metal layer 165 may remain between the top surface of the hardmask fin template(s) 121 and the fin cap(s) 172.

Figure 11:
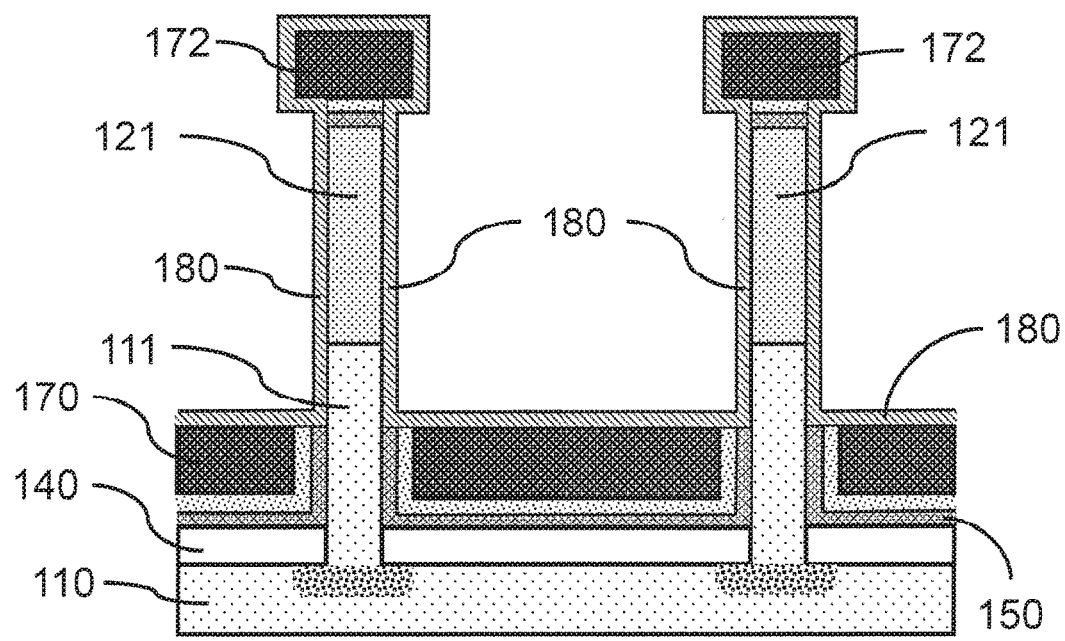
FIG. 11 is a cross-sectional side view of an oxide layer on the sidewalls of the hardmask fin template, the sidewalls of the vertical fin, and the bottom spacer in accordance with an exemplary embodiment.

FIG. 11 is a cross-sectional side view of an oxide layer on the sidewalls of the hardmask fin template, the sidewalls of the vertical fin, and the bottom spacer in accordance with an exemplary embodiment.

In one or more embodiments, an oxide layer 180 may be formed on the sidewalls of the hardmask fin template(s) 121 and the vertical fins 111 exposed after removal of the work function layer 160 and the gate metal layer 165, which were not covered by the gauge layer 170 and fin cap(s) 172. The oxide layer 180 may also be formed on the exposed surfaces of the fin cap(s) 172 and the exposed surfaces of the gauge layer 170. In various embodiments, the oxide layer 180 is silicon oxide (e.g., $SiO_2$) or a silicon oxide/silicon borocarbonitride (SiBCN) bilayer, which may be formed by chemical vapor deposition (CVD), ALD, or a combination thereof. The silicon oxide of the bilayer may be directly on the vertical sides of the hardmask fin templates 121, and the SiBCN may be formed on the silicon oxide.

Figure 12:
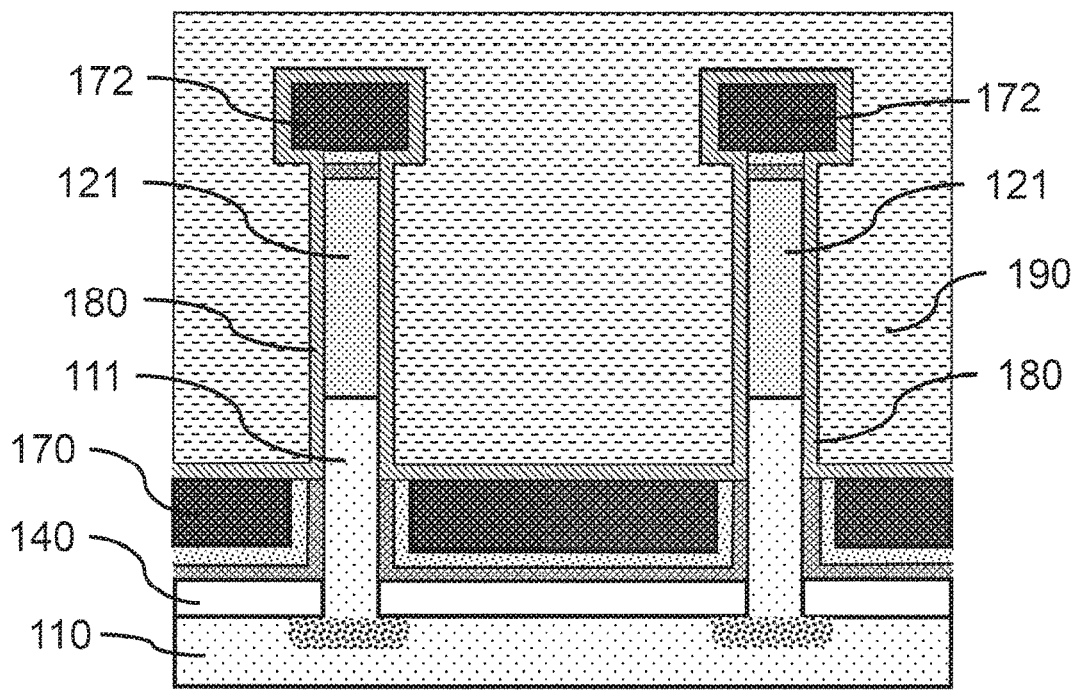
FIG. 12 is a cross-sectional side view of an organic planarization layer on the fin caps, hardmask fin templates, vertical fins, and the bottom spacer in accordance with an exemplary embodiment.

FIG. 12 is a cross-sectional side view of an organic planarization layer on the fin caps, hardmask fin templates, vertical fins, and the bottom spacer in accordance with an exemplary embodiment.

In one or more embodiments, an organic planarization layer 190 may be formed on the oxide layer 180 over the fin caps 172, hardmask fin templates 121, vertical fins 111, and the bottom spacer 170, where the organic planarization layer 190 may fill in the space between the neighboring hardmask fin templates 121 and vertical fins 111, and extend above the tops of the fin caps 172. The organic planarization layer 190 may be patterned and developed to expose underlying components.

Figure 13:
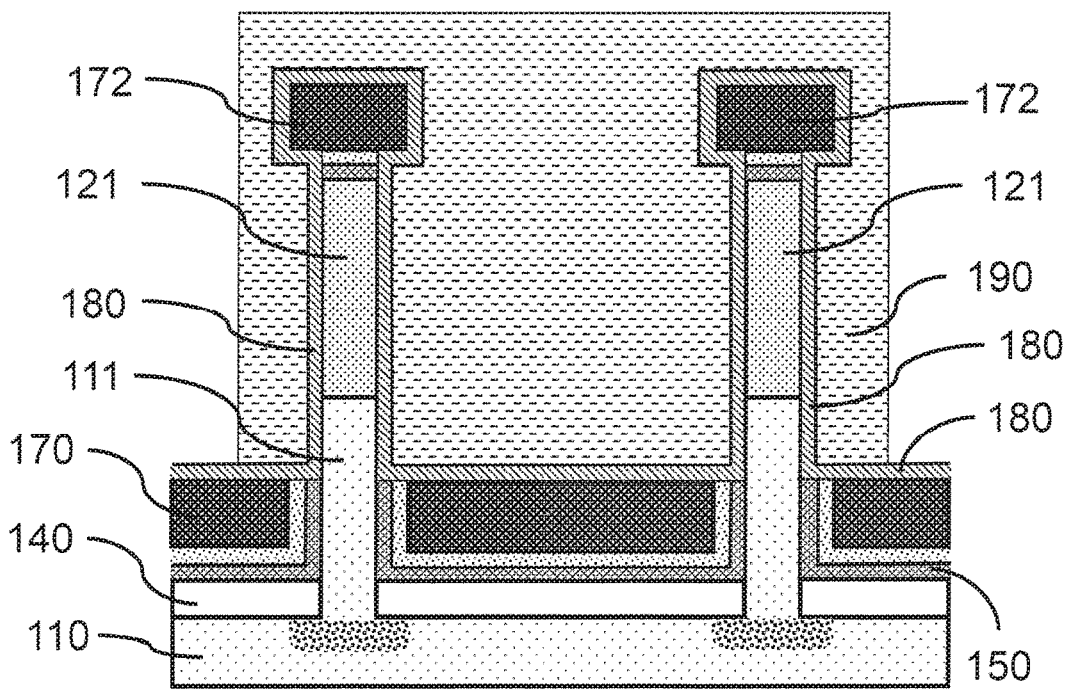
FIG. 13 is a cross-sectional side view of a partially removed organic planarization layer on the fin caps, hardmask fin templates, vertical fins, and the bottom spacer in accordance with an exemplary embodiment.

FIG. 13 is a cross-sectional side view of a partially removed organic planarization layer on the fin caps, hardmask fin templates, vertical fins, and the bottom spacer in accordance with an exemplary embodiment.

In one or more embodiments, at least a portion of the organic planarization layer 190 may be patterned, for example by using a resist, and removed to expose a portion of the oxide layer 180 on gauge layer 170. The OPL may be patterned and etched by a conventional lithography process, as known in the art. The OPL may act as a soft mask for further etching into the gauge layer 170 and gate metal to define a gate structure. The exposed portion of the oxide layer 180 may be adjacent to a portion of the vertical fin 111, where a gate structure may remain.

Figure 14:
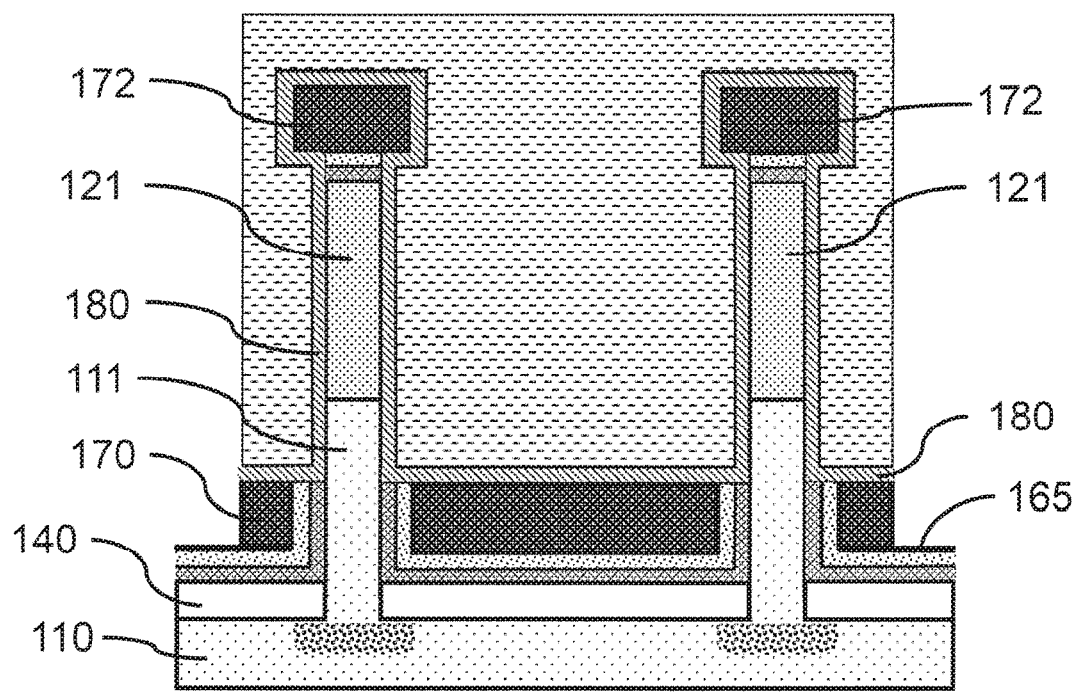
FIG. 14 is a cross-sectional side view of a partially removed organic planarization layer and gauge layer in accordance with an exemplary embodiment.

FIG. 14 is a cross-sectional side view of a partially removed organic planarization layer and gauge layer in accordance with an exemplary embodiment.

In one or more embodiments, after removal of a portion of the organic planarization layer 190, and oxide layer 180, a portion of the gauge layer 170 may be removed, where the gauge layer 170 may be removed by RIE.

After removal of the organic planarization layer 190, and oxide layer 180, a portion of the gauge layer 170, and a portion of the gate metal layer 165 may be exposed.

Figure 15:
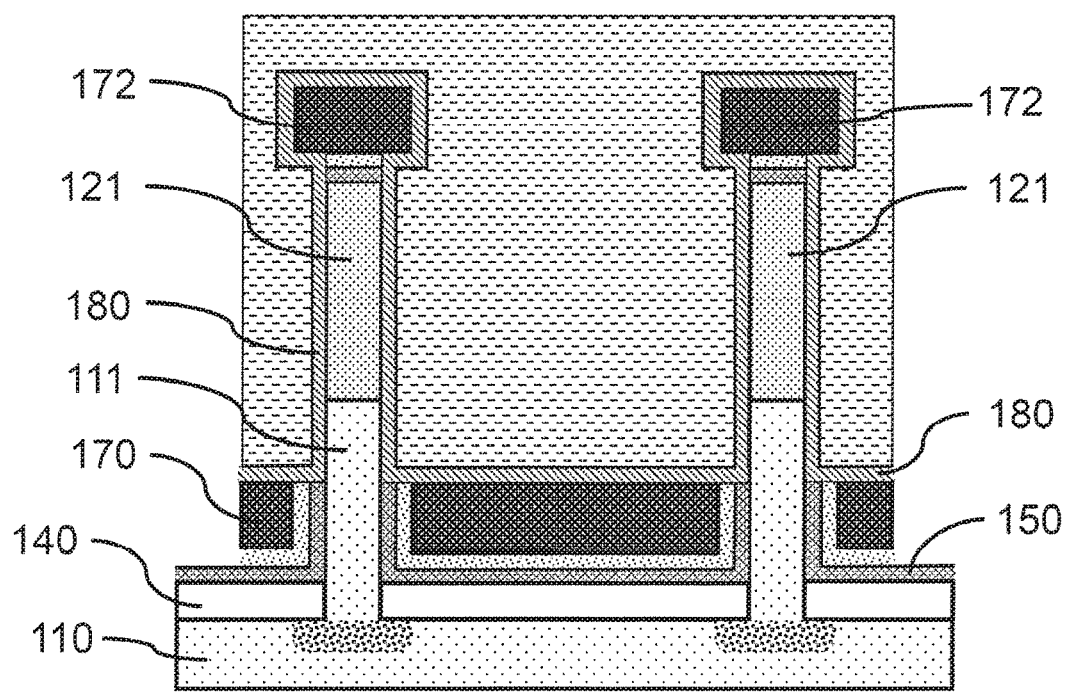
FIG. 15 is a cross-sectional side view of a partially removed organic planarization layer, gauge layer, and work function layer in accordance with an exemplary embodiment.

FIG. 15 is a cross-sectional side view of a partially removed organic planarization layer, gauge layer, and work function layer in accordance with an exemplary embodiment.

In one or more embodiments, the exposed gate metal layer 165 and underlying work function layer 160 may be removed to expose the underlying high-K dielectric layer 150. The gate metal layer 165 and work function layer 160 may be removed by RIE.

In various embodiments, the high-K dielectric layer 150 and bottom spacer 140 remain on the substrate 110, and may provide electrical insulation between the substrate 110 and the gate metal layer. Unneeded metal(s) (gate metal layer 165, work function layer 160) may be etched away. The gate metal layer 165 and underlying work function layer 160 may be removed to avoid electrically shorting the fabricated components on the substrate (e.g., wafer). Portions of the high-K dielectric layer 150 may also be removed in defining the gate structure for each vertical fin 111. In various embodiments, the high-K dielectric layer 150, the gate metal layer 165, and work function layer 160 may form a gate structure at least on opposite sides of the vertical fin 111. In various embodiments, the gate structure may wrap around three sides or four sides of the vertical fin.

Figure 16:
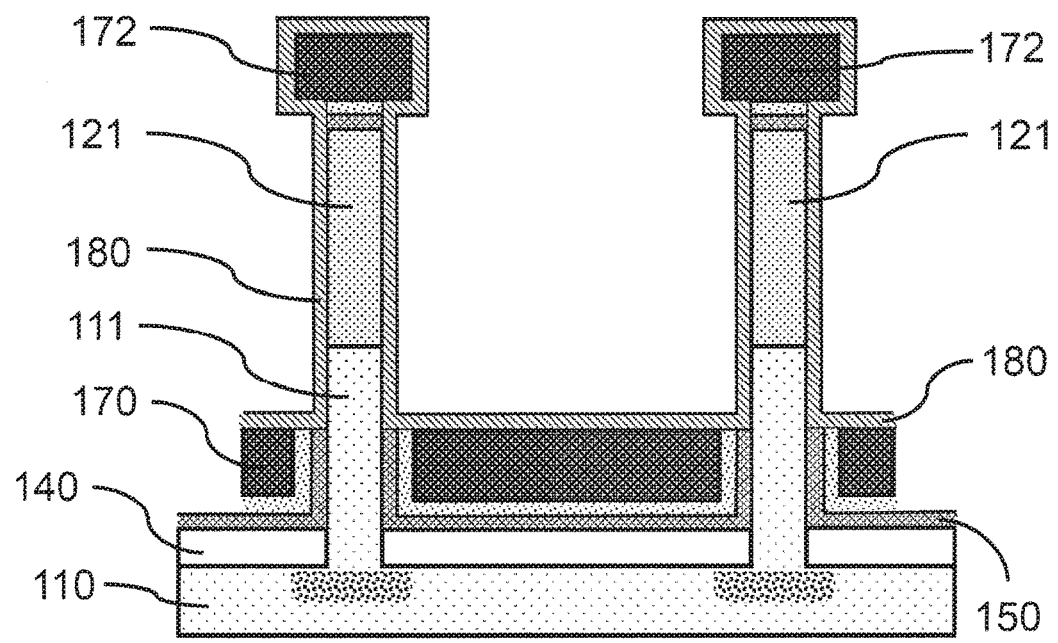
FIG. 16 is a cross-sectional side view of oxide layer on a gate structure after removal of the organic planarization layer in accordance with an exemplary embodiment.

FIG. 16 is a cross-sectional side view of oxide layer on a gate structure after removal of the organic planarization layer in accordance with an exemplary embodiment.

In one or more embodiments, the organic planarization layer 190 is removed, and the oxide layer 180 on the gauge layer 170 and fin caps 172 exposed. The organic planarization layer 190 may be removed by wet etching, for example, a sulfuric acid, hydrogen peroxide mixture (SPM) cleaning process, or the OPL may be removed by ashing.

Figure 17:
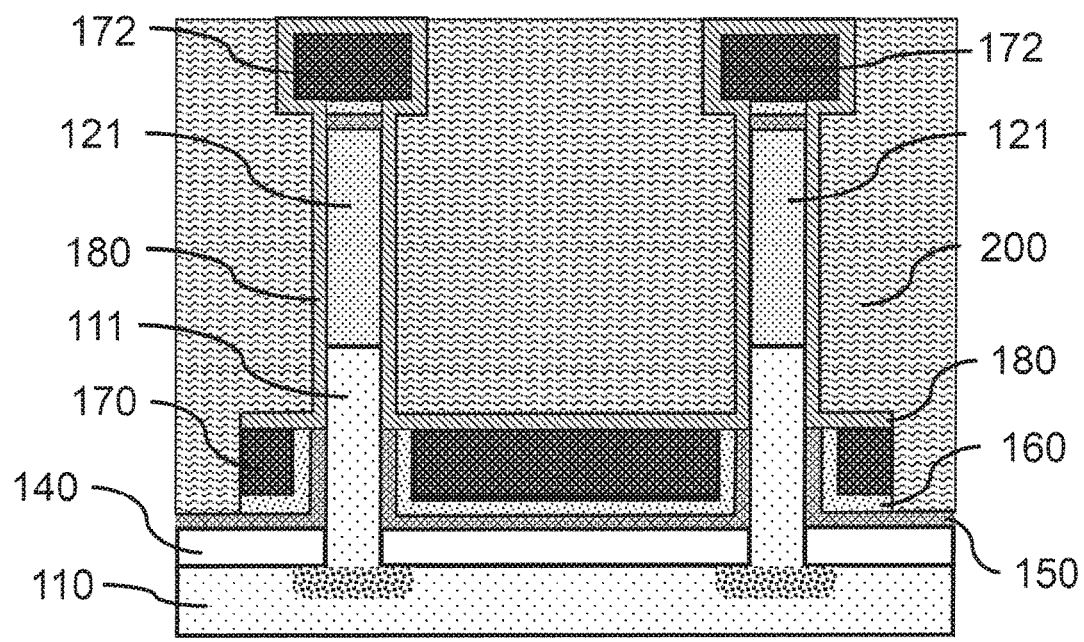
FIG. 17 is a cross-sectional side view of an oxide fill over the oxide layer on the fin caps, hardmask fin templates, vertical fins, and the bottom spacer in accordance with an exemplary embodiment.

FIG. 17 is a cross-sectional side view of an oxide fill over the oxide layer on the fin caps, hardmask fin templates, vertical fins, and the bottom spacer in accordance with an exemplary embodiment.

In one or more embodiments, after the organic planarization layer is removed, an oxide fill 200 may be formed on the oxide layer 180 over the fin caps 172, hardmask fin templates 121, vertical fins 111, and the bottom spacer 170, where the oxide fill 200 may fill in the space between neighboring hardmask fin templates 121 and vertical fins 111, and extend above the tops of the fin caps 172.

The height of the oxide fill 200 may be reduced to the height of the tops of the fin caps 172 to expose at least the portion of the oxide layer 180 over the fin caps 172. In various embodiments, the height of the oxide fill 200 may be reduced by chemical-mechanical polishing (CMP) and/or etching.

Figure 18:
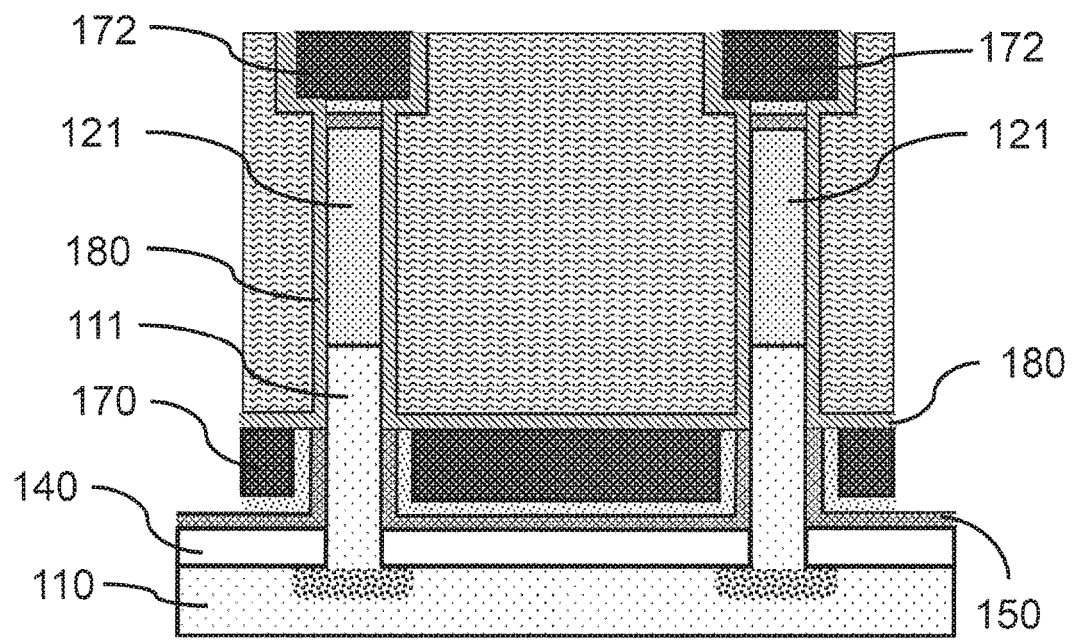
FIG. 18 is a cross-sectional side view of an oxide fill with exposed fin caps in accordance with an exemplary embodiment.

FIG. 18 is a cross-sectional side view of an oxide fill with exposed fin caps in accordance with an exemplary embodiment.

In one or more embodiments, the portion of the oxide layer 180 over the fin caps 172 may be removed to expose the fin caps. In various embodiments, the portion of the oxide layer 180 may be removed by chemical-mechanical polishing (CMP) and/or etching, where the portion of the oxide layer 180 may be removed at the same time as the oxide fill 200, or by a subsequent process.

Figure 19:
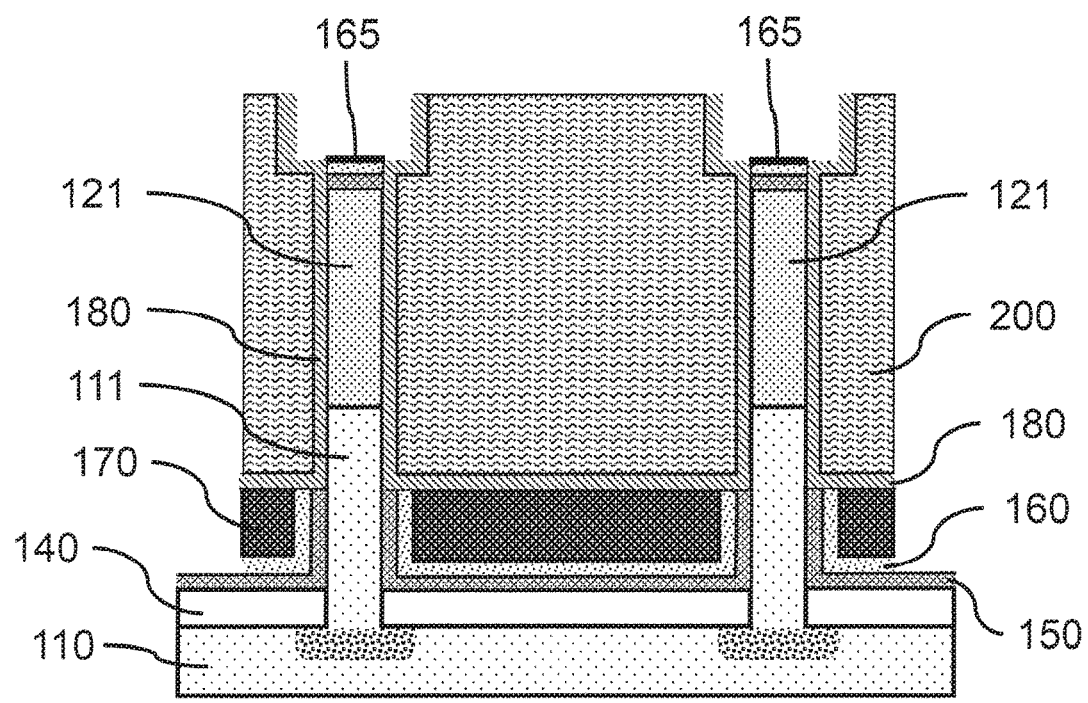
FIG. 19 is a cross-sectional side view of removed fin caps exposing the gate metal layer and work function layer in accordance with an exemplary embodiment.

FIG. 19 is a cross-sectional side view of removed fin caps exposing the gate metal layer and work function layer in accordance with an exemplary embodiment.

In one or more embodiments, the fin caps 172 may be removed to expose the gate metal layer 165 and the underlying work function layer 160. The fin caps 172 may be removed by etching, such as a dry plasma etch. After removal of the fin caps 172, the sides of the oxide layer 180 may be exposed. The exposed gate metal layer 165 may also be removed by etching to expose the underlying work function layer 160.

Figure 20:
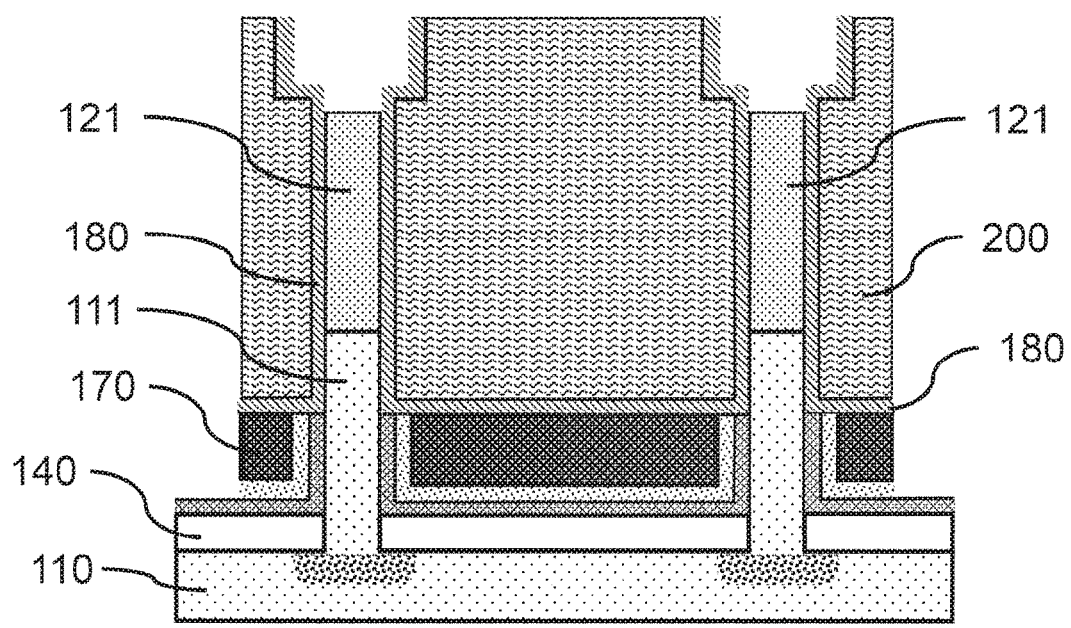
FIG. 20 is a cross-sectional side view of removed gate metal layer and work function layer exposing the hardmask fin templates in accordance with an exemplary embodiment.

FIG. 20 is a cross-sectional side view of removed gate metal layer and work function layer exposing the hardmask fin templates in accordance with an exemplary embodiment.

In one or more embodiments, the hardmask fin templates 121 may be exposed by removing the gate metal layer 165, the underlying work function layer 160, and the high-K dielectric layer 150. In various embodiments, each layer may be removed by a suitable etching process, where the underlying layer may act as an etch stop layer, and/or the layers may be removed by a chemical-mechanical polishing (CMP) process where the gate metal layer 165, the underlying work function layer 160, and the high-K dielectric layer 150 are removed, along with the remaining portions of the oxide layer 180 forming sidewalls and oxide fill 200 above the tops of the hardmask fin templates 121. The layers and oxide fill may be removed by a combination of etching and CMP.

Figure 21:
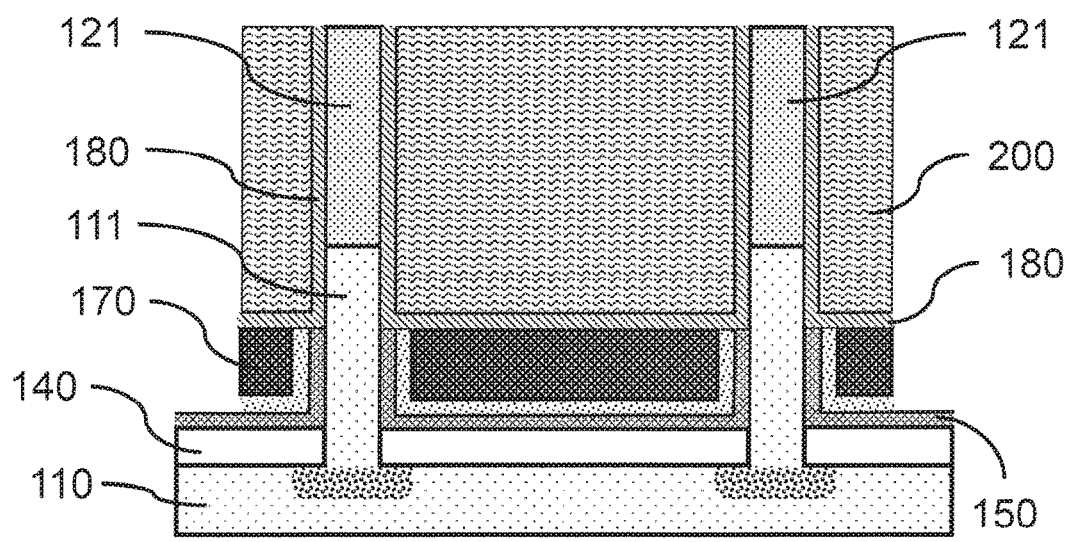
FIG. 21 is a cross-sectional side view of a planarized oxide fill exposing the hardmask fin templates in accordance with an exemplary embodiment.

FIG. 21 is a cross-sectional side view of a planarized oxide fill exposing the hardmask fin templates in accordance with an exemplary embodiment.

In one or more embodiments, the remaining portions of the oxide layer 180 forming sidewalls and the oxide fill 200 may be planarized to provide a uniform flat surface, where the tops of the hardmask fin templates 121 and the top surface of the oxide fill 200 may be coplanar. In various embodiments, a portion of the hardmask fin templates 121 may be removed by the planarization process to provide a flat, level surface.

Figure 22:
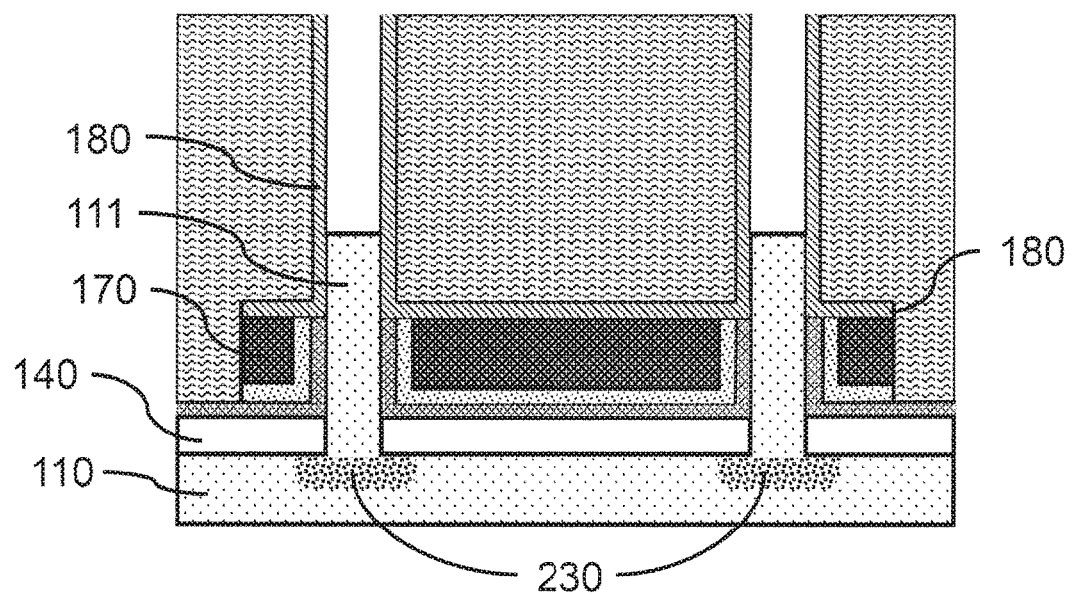
FIG. 22 is a cross-sectional side view of a trench formed between the oxide layer by removal of the hardmask fin templates in accordance with an exemplary embodiment.

FIG. 22 is a cross-sectional side view of a trench formed between the oxide layer by removal of the hardmask fin templates in accordance with an exemplary embodiment.

In one or more embodiments, the hardmask fin templates 121 may be selectively removed to expose the oxide layer 180 remaining on the oxide fill as vertical walls. The hardmask fin templates 121 may be selectively removed by RIE, where the vertical oxide walls remain essentially unaltered due to the selectivity and directionality of the RIE.

Figure 23:
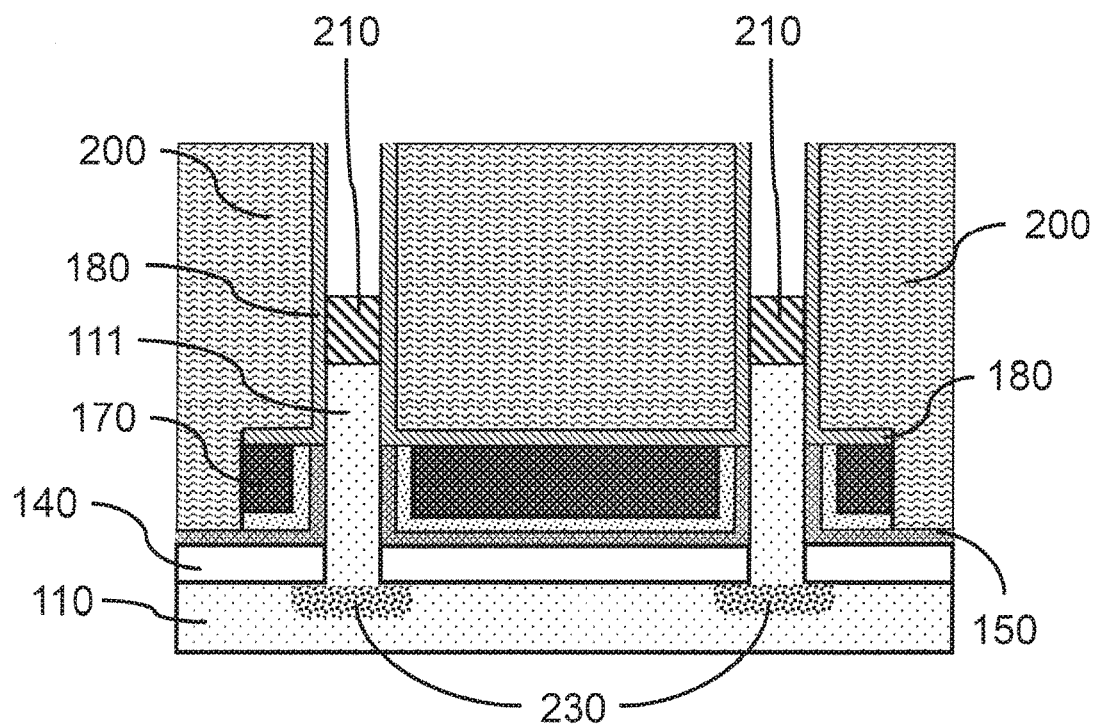
FIG. 23 is a cross-sectional side view of a source/drain formed in the trench between the vertical portions of the oxide layer in accordance with an exemplary embodiment.

FIG. 23 is a cross-sectional side view of a source/drain formed in the trench between the vertical portions of the oxide layer in accordance with an exemplary embodiment.

In one or more embodiments, a doped material forming a top source/drain 210 may be formed on the one or more vertical fin(s) 111. The top source/drain 210 may be formed by epitaxial growth on the vertical fin 111, such that the vertical fin 111 and the top source/drain 210 have the same crystal orientation. The top source/drain may be n-doped or p-doped.

In various embodiments, the locations of the source and drain of a vertical transistor may be reversed such that the drain is on the top of a vertical fin, while the source is at the bottom. The source may, therefore, be at the bottom or the top.

In one or more embodiments, the fabricated structure has a gate structure with a vertical dimension, the gate length, determined by the control of the gas cluster ion beam deposition process, where the gate length may be controlled to a tolerance in the range of about 100 Å to about 500 Å. Similarly, the gap between the top edge of the gate structure and the bottom of the source/drain 210 may be controlled to a tolerance in the range of about 30 Å to about 100 Å.

Figure 24:
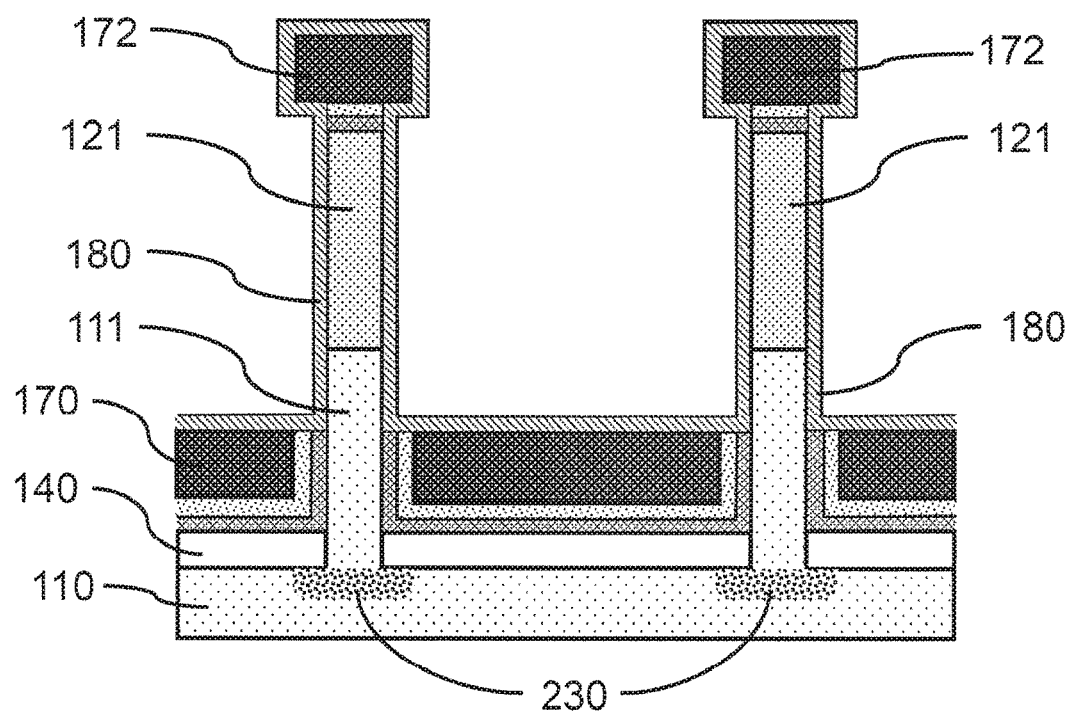
FIG. 24 is a cross-sectional side view of fin caps, hardmask fin templates, vertical fins, and the bottom spacer in accordance with another exemplary embodiment.

FIG. 24 is a cross-sectional side view of fin caps, hardmask fin templates, vertical fins, and the bottom spacer in accordance with another exemplary embodiment.

In one or more embodiments, the process may be varied by forming an oxide layer 180, as depicted in FIG. 11 and described in the associated text above, and forming a SiBCN layer 198 on at least a portion of the oxide layer 180.

Figure 25:
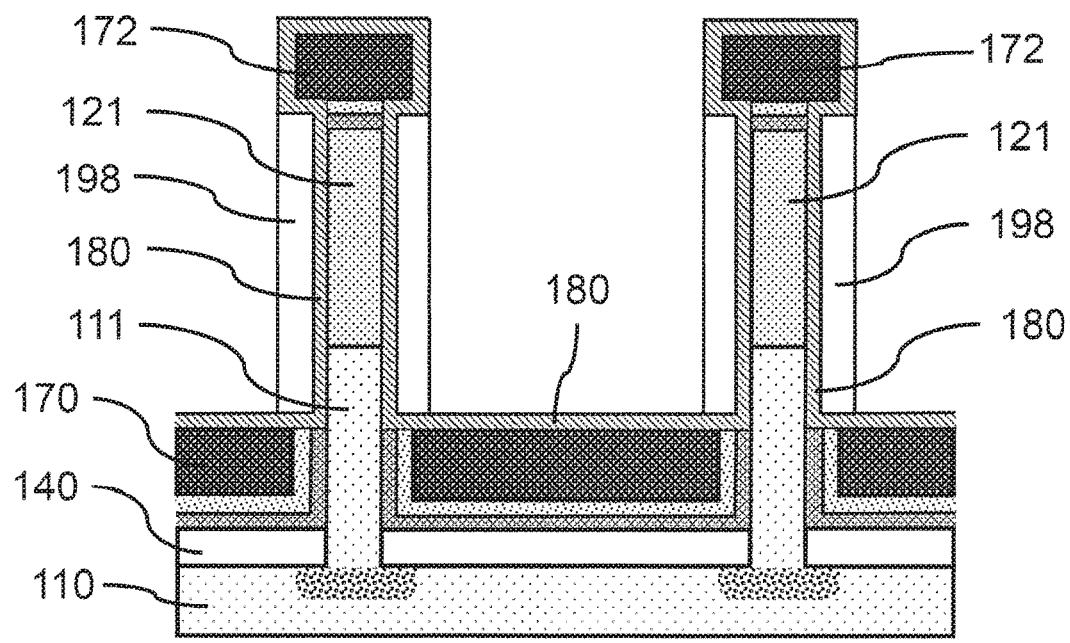
FIG. 25 is a cross-sectional side view of a selectively deposited SiBCN layer with portions remaining on hardmask fin templates, vertical fins, and the oxide layer in accordance with another exemplary embodiment.

FIG. 25 is a cross-sectional side view of a selectively deposited SiBCN layer with portions remaining on hardmask fin templates, vertical fins, and the oxide layer in accordance with another exemplary embodiment.

In one or more embodiments, at least a portion of the SiBCN layer 198 may be formed on at least a portion of the vertical sidewalls of the vertical fins 111 and hardmask fin templates 121. In various embodiments, a SiBCN layer 198 may be conformally deposited on the exposed surfaces, where the SiBCN layer 198 may be conformally deposited by atomic layer deposition (ALD) chemical vapor deposition (CVD), or combinations thereof. In various embodiments, the SiBCN layer 198 may be conformally deposited on at least the oxide layer 180 by ALD.

After formation of a SiBCN layer 198, the SiBCN may be selectively removed from at least portions of the surface, where selective removal may be by an anisotropic etch, for example, by reactive ion etching (RIE). After selective removal, at least a portion of the SiBCN layer 198 may remain on at least a portion of the vertical sidewalls of the vertical fins 111 and hardmask fin templates 121. The SiBCN layer 198 may remain on the sidewalls shadowed from the anisotropic etch by the oxide layer 180 and fin caps 172 on the hardmask fin templates 121. The SiBCN film may protect the oxide layer 180 formed on the sidewalls of the hardmask fin templates 121 and vertical fins 111 during subsequent etching processes.

Figure 26:
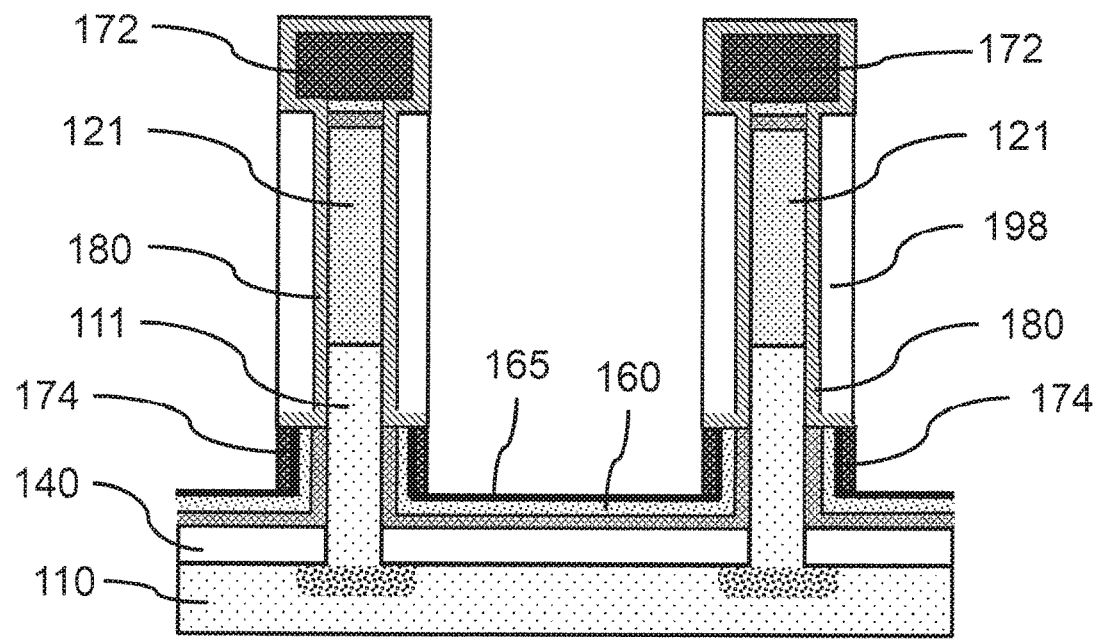
FIG. 26 is a cross-sectional side view of a partial SiBCN layer with a partially removed gauge layer forming gate structures in accordance with another exemplary embodiment.

FIG. 26 is a cross-sectional side view of a partial SiBCN layer with a partially removed gauge layer forming gate structures in accordance with another exemplary embodiment.

In one or more embodiments, after formation of the SiBCN layer 198 at least at least on a portion of the hardmask fin templates 121 and vertical fins 111, the exposed oxide layer 180 parallel with the substrate may be removed to expose the underlying portion of the gauge layer 170. The exposed portion of the gauge layer 170 may subsequently be removed to expose the underlying gate metal layer 165, which may be removed to reveal the underlying work function layer 160. In various embodiments, each of the layers may be removed by RIE, where the RIE provides selective, directional etching. Portions of the gauge layer 170 shadowed by the SiBCN layer 198 and oxide layer 180 may remain forming gauge layer spacers 174. The work function layer 160 and/or high-K dielectric layer 150 may remain on the vertical walls on the sides of vertical fins 111, and form at least a portion of a gate structure. The work function layer 160 and/or high-K dielectric layer 150 may remain on the bottom spacer 140 between the vertical fins 111.

Figure 27:
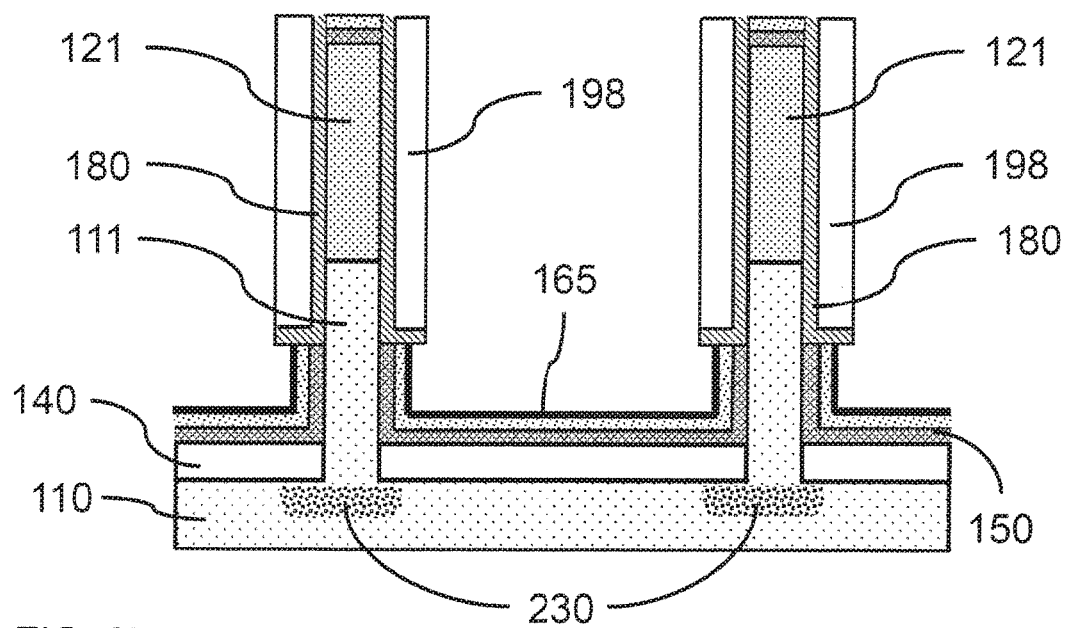
FIG. 27 is a cross-sectional side view of a removed fin cap exposing the gate metal layer in accordance with another exemplary embodiment.

FIG. 27 is a cross-sectional side view of a removed fin cap exposing the gate metal layer in accordance with another exemplary embodiment.

In one or more embodiments, the fin cap(s) 172 and oxide layer 180 above the gate metal layer 165 on the hardmask fin templates 121 may be removed to expose the underlying gate metal layer 165. The fin cap(s) and gate metal layer may be removed by CMP. The portion of the work function layer 160 on top of the hardmask fin templates 121 may be exposed after removal of the gate metal layer 165.

In one or more embodiments, the gauge layer spacers 174 may be selective removed by etching, while the layer of SiBCN remains on the sides of the vertical fins 111. The gauge layer spacers 174 may be selectively removed using a solution of hydrofluoric acid diluted with ethylene glycol (HFEG). Removal of the gauge layer spacers 174 may expose the gate metal layer 165 forming the gates structure(s) on the vertical fin(s) 111.

Figure 28:
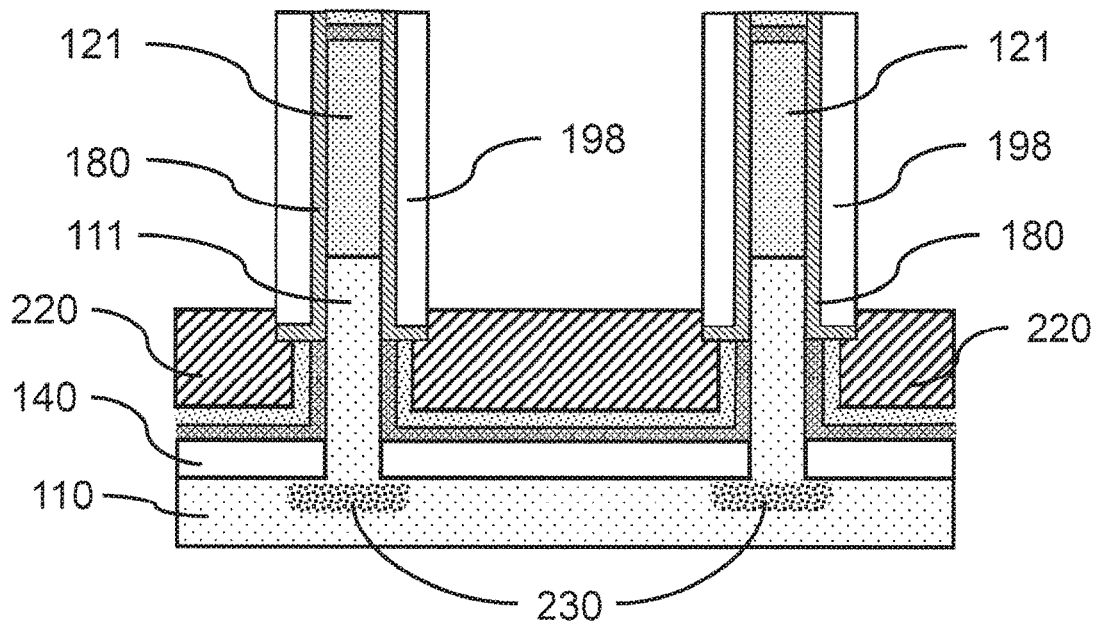
FIG. 28 is a cross-sectional side view of a gate electrode fill in the gaps between the gate structures of the vertical fins in accordance with another exemplary embodiment.

FIG. 28 is a cross-sectional side view of a gate electrode fill in the gaps between the gate structures of the vertical fins in accordance with another exemplary embodiment.

In one or more embodiments, a gate metal fill 220 may be deposited on the gate metal layer 165. The gate metal fill 220 may provide an electrical contact with the gate metal layer 165 to form a gate structure.

Figure 29:
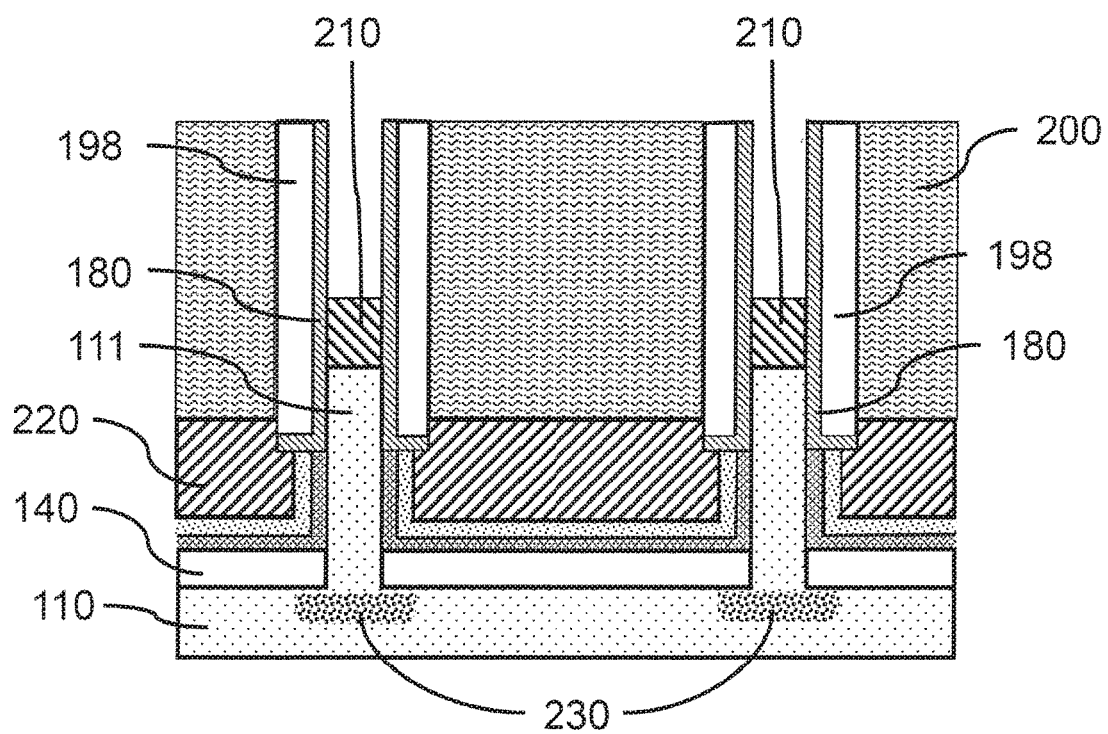
FIG. 29 is a cross-sectional side view of a vertical field effect transistor having a vertical fin, a gate structure with a gate electrode, and source/drain region on the vertical fin in accordance with another exemplary embodiment.

FIG. 29 is a cross-sectional side view of a vertical field effect transistor having a vertical fin, a gate structure with a gate electrode, and source/drain region on the vertical fin in accordance with another exemplary embodiment.

In one or more embodiments, the space above the metal fill layer 220 may be filled with an oxide fill 200 to fill in the space between neighboring SiBCN layer 198 on the vertical fins 111.

In one or more embodiments, a vertical finFET may include a bulk substrate having one or more doped regions in the substrate to form a bottom source/drain, one or more vertical fin(s) etched into the substrate, a bottom spacer on the horizontal substrate surface, where the bottom spacer defines a distance between the substrate and/or source/drain, and a gate structure. In various embodiments, the gate structure may include a high-K dielectric layer, a work function layer, and a gate electrode, where the height of the gate structure on the sides of the vertical fin may be controlled by the deposition process used to form at least the gauge layer 170, and control etching the high-K and work function layers of the gate structure. The vertical finFET may include a top source/drain on the top of the vertical fin(s), where the top source drain, bottom source/drain, and vertical fin form at least a portion of a vertical finFET. In various embodiments, the top source/drain and bottom source/drain may be n-doped or p-doped.

In an exemplary embodiment, a vertical finFET may have one or more vertical fins formed on a substrate; a doped region in the substrate located below at least one of the one or more vertical fins; a bottom spacer on the substrate and adjacent the sidewall of at least one of the one or more vertical fins; a high-K dielectric layer on at least a portion of the sidewalls of at least one of the one or more vertical fins; a work function layer on the high-K dielectric layer on the portion of the sidewalls of at least one of the one or more vertical fins; a gate metal layer on at least a portion of the work function layer; a gauge layer having a thickness, wherein a bottom surface of the gauge layer in on at least a portion of the gate metal layer and a top surface of the gauge layer is coplanar with an edge of the high-K dielectric layer on at least a portion of the sidewalls of at least one of the one or more vertical fins; and an oxide fill, where the oxide fill fills in the space between neighboring vertical fins.

An exemplary embodiment of a vertical finFET includes one or more vertical fins formed on a substrate; a doped region in the substrate located below at least one of the one or more vertical fins; a bottom spacer on the substrate and adjacent the sidewall of at least one of the one or more vertical fins; a high-K dielectric layer on at least a portion of the sidewalls of at least one of the one or more vertical fins; a work function layer on the high-K dielectric layer on the portion of the sidewalls of at least one of the one or more vertical fins; a gate metal layer on at least a portion of the work function layer; a nitride layer having a thickness, wherein a bottom surface of the nitride layer in on at least a portion of the gate metal layer and a top surface of the nitride layer is coplanar with an edge of the high-K dielectric layer on at least a portion of the sidewalls of at least one of the one or more vertical fins; and an oxide fill, where the oxide fill fills in the space between neighboring vertical fins.

An exemplary embodiment of a method of forming a gate structure includes forming one or more vertical fins on a substrate; forming a bottom spacer on the substrate surface adjacent to the one or more vertical fins; forming a high-K dielectric layer on at least the exposed surface of the bottom spacer and the sidewalls of the one or more vertical fins; forming a work function layer on the high-K dielectric layer; forming a gate metal layer on the work function layer; forming a nitride layer on at least a portion of the gate metal layer over the bottom spacer, wherein the nitride layer covers at least a portion of the gate metal layer on the sidewalls of the one or more vertical fins; removing at least a portion of the gate metal layer, work function layer, and high-K dielectric layer on the sidewalls of the one or more vertical fins; forming an organic planarization layer on the nitride layer, where the organic planarization layer covers the sidewalls of the one or more vertical fins and extends above the top of the one or more vertical fins; patterning and removing a portion of the organic planarization layer over the nitride layer to expose a portion of the nitride layer; and removing the exposed portion of the nitride layer on the gate metal layer, and underlying work function layer to form a gate structure on the sidewalls of the one or more vertical fins.

Having described preferred embodiments for the fabrication of vertical field effect transistor structure with controlled gate length (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A vertical fin field effect transistor (finFET), comprising:
   one or more vertical fins formed on a substrate;
   a doped region in the substrate located below at least one of the one or more vertical fins;
   a gate structure on at least a portion of the sidewalls of at least one of the one or more vertical fins, wherein the gate structure includes a dielectric layer on at least a portion of the sidewalls of at least one of the one or more vertical fins and a gate metal layer on at least a portion of the dielectric layer; and
   a gauge layer having a thickness, wherein a bottom surface of the gauge layer is on at least a portion of the gate metal layer of the gate structure and a top surface of the gauge layer is coplanar with an edge of the gate structure on the at least a portion of the sidewalls of the least one of the one or more vertical fins.

2. The vertical finFET of claim 1, wherein the one or more vertical tins have a height in the range of about 25 nm to about 75 nm.

3. The vertical finFET of claim 1, further comprising a top source/drain on the top surface of at least one of the one or more vertical fins.

4. The vertical finFET of claim 1, wherein the gauge layer is silicon nitride.

5. The vertical finFET of claim 4, wherein the thickness of the silicon nitride gauge layer is in the range of about 10 nm to about 50 nm, where the thickness of the silicon nitride gauge layer defines a gate length.

6. The vertical finFET of claim 1, wherein the dielectric layer of the gate structure is a high-K dielectric layer.

7. The vertical finFET of claim 6, wherein the high-K dielectric layer has a thickness in the range of about 1.5 nm to about 2.5 nm.

8. The vertical finFET of claim 6, wherein the gate metal layer is tungsten (W), cobalt (Co), or a combination thereof.

9. The vertical finFET of claim 1, further comprising an oxide where the oxide fill fills in the space between neighboring vertical fins.

10. A vertical fin field effect transistor (finFET), comprising:
    one or more vertical fins formed on a substrate;
    a bottom spacer on the substrate and adjacent the sidewall of at of the one or more vertical fins;
    a gate structure on at least a portion of the sidewalls of at least one of the one or more vertical fins, wherein the gate structure has a gate length, wherein the gate structure includes a dielectric layer on at least a portion of the sidewalls of at least one of the one or more vertical fins and a gate metal layer on at least a portion of the dielectric layer;
    an oxide layer on at least a portion of at least one of the one or more vertical fins; and
    a SiBCN layer on the oxide layer.

11. The vertical finFET of claim 10, wherein the dielectric layer is a high-K dielectric layer selected from the group consisting of hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, and titanium oxide.

12. The vertical finFET of claim 10, wherein the SiBCN layer and the oxide layer are above at least a portion of the dielectric layer on the at least a portion of the sidewalls of the at least one of the one or more vertical fins.

13. The vertical finFET of claim 12, further comprising a top source/drain on at least one of the one or more vertical fins.

14. The vertical finFET of claim 13, wherein the oxide layer forms a vertical wall adjacent to the top source drain on the at least one of the one or more vertical fins.

15. The vertical finFET of claim 13, wherein the top source/drain is n-doped or p-doped.

16. The vertical finFET of claim 15, further comprising a doped region in the substrate located below at least one of the one or more vertical fins, where the doped region is n-doped or p-doped.

17. The vertical finFET of claim 16, wherein the one or more vertical fins have a height in the range of about 25 nm to about 75 nm.

18. The vertical finFET of claim 17, wherein the gate length is in the range of about 10 nm to about 50 nm.

19. A vertical fin field effect transistor (finFET), comprising:
    one or more vertical fins formed on a substrate;
    a doped region in the substrate located below at least one of the one or more vertical fins;
    a bottom spacer on the substrate and adjacent the sidewall of at least one of the one or more vertical fins;
    a high-k dielectric layer on at least a portion of the bottom spacer and at least a portion of the sidewalls of at least one of the one or more vertical fins;
    a work function layer on at least a portion of the high-k dielectric layer;
    a gate metal layer on at least a portion of the work function layer;
    a gauge layer on at least a portion of the gate metal layer; and
    an oxide layer on at least a portion of at least one of the one or more vertical fins, at least a portion of the high-k dielectric layer, and on at least a portion of the gauge layer.

20. The vertical finFET of claim 19, wherein the gauge layer has a thickness in the range of about 10 nm to about 50 nm, and the total thickness of the gate metal layer and the work function layer is in the range of about 6 nm to about 12 nm.

* * * * *